US011295804B2

(12) United States Patent
Tian (10) Patent No.: US 11,295,804 B2
(45) Date of Patent: Apr. 5, 2022

(54) OUTPUT CIRCUIT AND CHIP (71) Applicant: Changxin Memory Technologies, Inc., Anhui (CN)

(72) Inventor: Kai Tian, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/172,319

(22) Filed: Feb. 10, 2021

(65) Prior Publication Data
US 2021/0166748 A1 Jun. 3, 2021

Related U.S. Application Data (63) Continuation of application No. PCT/CN2019/120207, filed on Nov. 22, 2019.

(30) Foreign Application Priority Data

Jan. 7, 2019 (CN) .......................... 201910012322.0

(51) Int. Cl.
*G11C 11/4074* (2006.01)
(52) U.S. Cl.
CPC ................... *G11C 11/4074* (2013.01)
(58) Field of Classification Search
CPC . G11C 11/4074; G11C 29/022; G11C 29/028; G11C 2207/2254; G11C 7/1057;
(Continued)

(56) References Cited

U.S. PATENT DOCUMENTS 7,714,618 B2 5/2010 Chen
10,145,892 B2 * 12/2018 Franch ............... G01R 31/2884
(Continued)

FOREIGN PATENT DOCUMENTS

CN 102487240 A 6/2012
CN 107947784 A 4/2018
(Continued)

OTHER PUBLICATIONS

PCT International Search Report and the Written Opinion dated Feb. 25, 2020, issued in related International Application No. PCT/CN2019/120207 (10 pages).
(Continued)

*Primary Examiner* — Tri M Hoang
(74) *Attorney, Agent, or Firm* — Sheppard Mullin Richter & Hampton LLP (57) ABSTRACT

The present invention provides an output circuit and a chip. The output circuit includes a first-stage circuit, a second-stage circuit, a third-stage circuit, and a fourth-stage circuit. The first-stage circuit is configured to read serial data in a memory and divide the serial data into first voltage signals each at a specified rate level; the second-stage circuit is configured to receive the first voltage signals, generate a plurality of second voltage signals; the third-stage circuit is configured to: allocate a transmission path to each of the second voltage signals according to a ZQ calibration signal; and the fourth-stage circuit includes a pull-up circuit and a pull-down circuit, each including thin-gate low-threshold NMOS transistors, and the fourth-stage circuit is configured to generate output voltage signals of the output circuit. By eliminating the limit on a minimum operating power supply voltage, different high-speed data output ports are compatible, thereby improving efficiency.

20 Claims, 8 Drawing Sheets (58) Field of Classification Search
CPC ... G11C 29/12005; G11C 16/26; G11C 16/30; G11C 29/32; G11C 5/147
See application file for complete search history.

(56) References Cited

U.S. PATENT DOCUMENTS

| | | | |
|---|---|---|---|
| 10,607,560 B2* | 3/2020 | Tsuchi | G09G 3/3685 |
| 10,614,870 B2* | 4/2020 | Ho | G11C 11/4085 |
| 2015/0063041 A1 | 3/2015 | Arai | |
| 2017/0092348 A1 | 3/2017 | Koo | |
| 2020/0051655 A1* | 2/2020 | Dong | G11C 19/28 |
| 2021/0350739 A1* | 11/2021 | Hu | G09G 3/20 |

FOREIGN PATENT DOCUMENTS

| | | |
|---|---|---|
| CN | 108305647 A | 7/2018 |
| CN | 209045167 U | 6/2019 |

OTHER PUBLICATIONS

Extended European Search Report dated Feb. 7, 2022, issued in related European Patent Application No. 19909127.3 (10 pages).
M. Chae et al., "Multi-Standard Low-Power DDR I/O Circuit Design in 7nm CMOS Process", 2017 IEEE International Symposium on Circuits and Systems (ISCAS), IEEE, May 28, 2017, pp. 1-4.

* cited by examiner

OUTPUT CIRCUIT AND CHIP

CROSS-REFERENCE TO RELATED APPLICATIONS

This application is a continuation application of International Patent Application No.: PCT/CN2019/120207, which claims priority to Chinese Patent Application No. 201910012322.0, filed with the Chinese Patent Office on Jan. 7, 2019 and entitled "OUTPUT CIRCUIT AND CHIP." The above-referenced applications are incorporated herein by reference in their entirety.

TECHNICAL FIELD

The present invention relates to semiconductor memories, and in particular, to an output circuit and a chip.

BACKGROUND

In both LPDDR4 (Low Power Double Data Rate SDRAM 4) and LPDDR4X applications, a high-speed interface standard of LVSTL (Low Voltage Swing Terminated Logic) is used, and different output pull-down driver capabilities and output high levels can be configured by a memory controller. However, because voltages of data output ports of the two are different, LPDDR4 and LPDDR4X cannot be applied to the same chip. This brings trouble to the application and design of the chip.

SUMMARY

The present invention provides an output circuit and a chip to at least resolve the foregoing technical problem in the prior art.

To achieve the foregoing objective, the present invention provides an output circuit, including: a first-stage circuit, a second-stage circuit, a third-stage circuit, and a fourth-stage circuit.

The first-stage circuit is configured to read serial data in a memory and divide the serial data into a plurality of first voltage signals each at a specified rate level.

The second-stage circuit is connected to the first-stage circuit, and is configured to: receive the plurality of first voltage signals output by the first-stage circuit, generate a plurality of second voltage signals, and allocate a transmission path to each of the generated second voltage signals.

The third-stage circuit is connected to the second-stage circuit, and is configured to: receive the plurality of second voltage signals output by the second-stage circuit, and allocate a transmission path to each of the second voltage signals according to a ZQ calibration signal.

The fourth-stage circuit is connected to the third-stage circuit, and includes a pull-up circuit and a pull-down circuit. The pull-up circuit and the pull-down circuit each include a plurality of parallel thin-gate low-threshold NMOS transistors, and the fourth-stage circuit is configured to receive a plurality of third voltage signals output by the third-stage circuit, and generate output voltage signals of the output circuit according to the third voltage signals.

In some embodiments, the pull-up circuit may include a plurality of parallel pull-up branches, each of the pull-up branches includes a first thin-gate low-threshold NMOS transistor with substantially the same structure, the drain of the first thin-gate low-threshold NMOS transistor is connected to a power supply voltage, and the gate of the first thin-gate low-threshold NMOS transistor is configured to receive a pull-up voltage signal output by the third-stage circuit; and the sources of the first thin-gate low-threshold NMOS transistors of the pull-up branches are connected as a data output terminal (DQ).

In some embodiments, the pull-down circuit may include a plurality of parallel pull-down branches, each of the pull-down branches includes a second thin-gate low-threshold NMOS transistor with substantially the same structure, the source of the second thin-gate low-threshold NMOS transistor is grounded, the drain of the second thin-gate low-threshold NMOS transistor is connected to the source of the first thin-gate low-threshold NMOS transistor, and the gate of the second thin-gate low-threshold NMOS transistor is configured to receive a pull-down voltage signal output by the third-stage circuit.

In some embodiments, the third-stage circuit may be further configured to output a plurality of pull-up ZQ calibration signals during ZQ calibration; and each of the pull-up branches may include a plurality of third thin-gate low-threshold NMOS transistors, and the third thin-gate low-threshold NMOS transistor in each pull-up branch may be connected in parallel to the first thin-gate low-threshold NMOS transistor; and the gate of the third thin-gate low-threshold NMOS transistor may be configured to receive the pull-up ZQ calibration signal, and the third thin-gate low-threshold NMOS transistor may be configured to adjust an equivalent resistance of the pull-up branch to RZQ (reference resistance) according to the pull-up ZQ calibration signal.

In some embodiments, the third-stage circuit may be further configured to output a plurality of pull-down ZQ calibration signals during ZQ calibration; and each of the pull-down branches may include a plurality of fourth thin-gate low-threshold NMOS transistors, and the fourth thin-gate low-threshold NMOS transistor in each pull-down branch may be connected in parallel to the second thin-gate low-threshold NMOS transistor; and the gate of the fourth thin-gate low-threshold NMOS transistor may be configured to receive the pull-down ZQ calibration signal, and the fourth thin-gate low-threshold NMOS transistor may be configured to adjust an equivalent resistance of the pull-down branch to RZQ according to the pull-down ZQ calibration signal.

In some embodiments, the plurality of third thin-gate low-threshold NMOS transistors and the plurality of fourth thin-gate low-threshold NMOS transistors may each have successively increasing equivalent width-to-length ratios.

In some embodiments, the pull-up circuit may further include a pull-up switch module, the pull-up switch module may include the same quantity of thick-gate high-threshold NMOS transistors as that of the first thin-gate low-threshold NMOS transistors, the drains of the thick-gate high-threshold NMOS transistors may be connected to the power supply voltage, the sources of the thick-gate high-threshold NMOS transistors may be respectively connected to the drains of the first thin-gate low-threshold NMOS transistors, and the gates of the thick-gate high-threshold NMOS transistors may be configured to receive a high-voltage threshold signal output by the third-stage circuit.

In some embodiments, each of the pull-up branches may further include at least one first low-voltage calibration MOS transistor. The first low-voltage calibration MOS transistor may be connected in parallel to the first thin-gate low-threshold NMOS transistor, the gate of the first low-voltage calibration MOS transistor may be connected to the third-stage circuit, and the first low-voltage calibration MOS transistor may be configured to be turned on at the time of receiving a low-voltage signal.

In some embodiments, each of the pull-down branches may further include at least one second low-voltage calibration MOS transistor. The second low-voltage calibration MOS transistor may be connected in parallel to the second thin-gate low-threshold NMOS transistor, the gate of the second low-voltage calibration MOS transistor may be connected to the third-stage circuit, and the second low-voltage calibration MOS transistor may be configured to be turned on at the time of receiving a low-voltage signal.

In some embodiments, a first fixed-value resistor may be connected in series between the data output terminal and a source connection terminal of the first thin-gate low-threshold NMOS transistor and the first low-voltage calibration MOS transistor, and a second fixed-value resistor may be connected in series between a source connection terminal of the plurality of third thin-gate low-threshold NMOS transistors and the data output terminal; and a third fixed-value resistor may be connected in series between the data output terminal and a source connection terminal of the second thin-gate low-threshold NMOS transistor and the second low-voltage calibration MOS transistor, and a fourth fixed-value resistor may be connected in series between a source connection terminal of the plurality of fourth thin-gate low-threshold NMOS transistors and the data output terminal.

In some embodiments, the first-stage circuit may include a first pull-up control module and a first pull-down control module that are of substantially the same structure, and both the first pull-up control module and the first pull-down control module may be configured to delay a read data signal, and divide and output the data signal into data signals of a plurality of rate levels.

In some embodiments, the second-stage circuit may include: a second pull-down control module. The second pull-down control module may be configured to: receive a data signal output by the first pull-down control module, and according to pull-down driver setting strength and an ODT (On Die Terminator) enable signal, select a path to output the data signal; a second pull-up control module, where the second pull-up control module is configured to: receive a data signal output by the first pull-up control module, and according to pull-up driver setting strength, select a path to output the data signal; and a pull-up switch control module. The pull-up switch control module may be configured to receive a switch enable signal and reuse the pull-up driver setting strength, so as to control each path in the second pull-up control module to be in one of an ON state and an OFF state.

In some embodiments, the third-stage circuit may include a third pull-up control module and a third pull-down control module that have substantially the same structure.

An input terminal of the third pull-up control module may be connected to the second pull-up control module and a ZQ calibration value, and an output terminal of the third pull-up control module may be connected to the gate of the first thin-gate low-threshold NMOS transistor; and the third pull-up control module may be configured to convert a received data signal and the ZQ calibration value into the pull-up voltage signal of the same rate and the pull-up ZQ calibration signal corresponding to the received data signal; and an input terminal of the third pull-down control module may be connected to the second pull-down control module and a ZQ calibration value, and an output terminal of the third pull-down control module may be connected to the gate of the second thin-gate low-threshold NMOS transistor; and the third pull-down control module may be configured to convert a received data signal and the ZQ calibration value into the pull-down voltage signal of the same rate and the pull-down ZQ calibration signal corresponding to the received data signal.

To achieve the foregoing objective, the present invention provides a chip, including the output circuit of the foregoing embodiments.

By using the foregoing technical solution, the present invention has the following advantages: The pull-up circuit is used to eliminate the limit on a minimum operating power supply voltage caused by an enable threshold voltage, so that two or more different high-speed data transmission standards become compatible. Thus the chip may operate in two environments with different output levels, thereby improving efficiency and reducing resource consumption.

The foregoing description is for the purpose of the specification only and is not intended to be restrictive in any way. In addition to the schematic aspects, implementations, and features described above, with reference to the accompanying drawings and the following detailed descriptions, further aspects, implementations, and features of the present invention will be readily understood.

BRIEF DESCRIPTION OF DRAWINGS

In the accompanying drawings, reference numerals that are identical throughout the plurality of accompanying drawings represent identical or similar components or elements, unless otherwise specified. These accompanying drawings are not necessarily drawn in scale. It should be understood that the accompanying drawings describe only some embodiments of the present invention, and should not be considered as limiting the scope of the present invention.

REFERENCE NUMERALS 100 first-stage circuit;
110 first pull-up control module;
120 first pull-down control module;

130 delay unit;
200 second-stage circuit;
210 second pull-down control module;
210a pull-down path unit;
211 first NAND gate;
212 second NAND gate;
213 third NAND gate;
220 second pull-up control module;
220a pull-up path unit;
221 fourth NAND gate;
222 first phase inverter;
230 pull-up switch control module;
230a pull-up switch unit;
231 fifth NAND gate;
232 second phase inverter;
300 third-stage circuit;
310 third pull-up control module;
320 third pull-down control module;
330 pull-up control submodule;
340 pull-down control submodule;
331 sixth NAND gate;
332 third phase inverter;
400 fourth-stage circuit;
410 pull-up circuit;
411 pull-up branch;
411a first thin-gate low-threshold NMOS transistor;
411b first low-voltage calibration MOS transistor;
411c Third thin-gate low-threshold NMOS transistor;
411d first fixed-value resistor;
411e second fixed-value resistor;
420 pull-down circuit;
421 pull-down branch;
421a second thin-gate low-threshold NMOS transistor;
421b second low-voltage calibration MOS transistor;
421c fourth thin-gate low-threshold NMOS transistor;
421d third fixed-value resistor;
421e fourth fixed-value resistor;
430 pull-up switch module;
431 thick-gate high-threshold NMOS transistor.

DESCRIPTION OF EMBODIMENTS

In the following, only some example embodiments are briefly described. As will be appreciated by those skilled in the art, the described embodiments may be modified in various ways without departing from the spirit or scope of the present invention. Therefore, the accompanying drawings and descriptions are considered to be essentially exemplary and not limiting.

A first aspect of the embodiments provides an output circuit.

Figure 1:
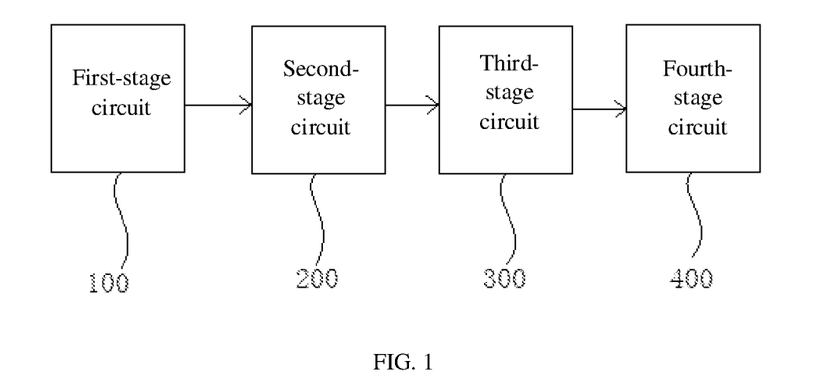
FIG. 1 is a schematic connection diagram of an output circuit according to an embodiment of the present invention.

Referring to FIG. 1, the output circuit includes a first-stage circuit 100, a second-stage circuit 200, a third-stage circuit 300, and a fourth-stage circuit 400.

The first-stage circuit 100 is configured to: read serial data in a memory and divide the serial data into a plurality of voltage signals each at a specified rate level. The voltage signals output by the first-stage circuit 100 may be referred to as the first voltage signals.

The second-stage circuit 200 is connected to the first-stage circuit 100, and the second-stage circuit 200 is configured to: receive the plurality of voltage signals output by the first-stage circuit 100 (i.e., the plurality of first voltage signals), generate a plurality of voltage signals, and allocate a transmission path to each of the generated voltage signals. The voltage signals generated by the second-stage circuit 200 may be referred to as the second voltage signals.

The third-stage circuit 300 is connected to the second-stage circuit 200, and the third-stage circuit 300 is configured to: receive the plurality of voltage signals output by the second-stage circuit 200 (i.e., the second voltage signals), and allocate a transmission path to each of the received voltage signals (i.e., the second voltage signals) according to a ZQ calibration signal. The third-stage circuit 300 is further configured to adjust a voltage conversion rate of a data signal to control a voltage conversion rate of the fourth-stage circuit 400.

Figure 2:
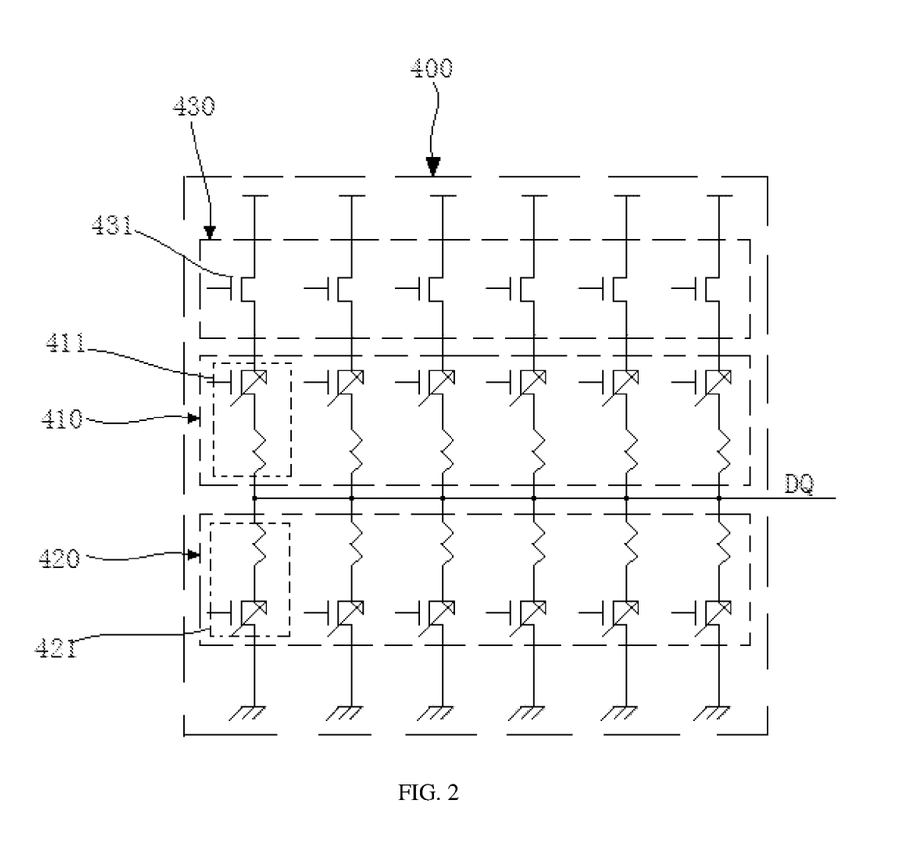
FIG. 2 is a schematic structural diagram of a fourth-stage circuit according to an embodiment of the present invention.

The fourth-stage circuit 400 is connected to the third-stage circuit 300. As shown in FIG. 2, the fourth-stage circuit 400 includes a pull-up circuit 410 and a pull-down circuit 420. Both the pull-up circuit 410 and the pull-down circuit 420 include a plurality of parallel thin-gate low-threshold NMOS transistors. The fourth-stage circuit 400 is configured to receive the plurality of voltage signals output by the third-stage circuit 300, and generate output voltage signals of the output circuit according to the received voltage signals. The plurality of voltage signals output by the third-stage circuit 300 may be referred to as the third voltage signals.

The thin-gate low-threshold NMOS transistors in the pull-up circuit 410 and the pull-down circuit 420 are configured to eliminate the limit on a minimum operating power supply voltage caused by a MOS transistor enable threshold voltage.

In this embodiment, the thin-gate low-threshold NMOS transistors in the pull-up circuit 410 and the pull-down circuit 420 increase a response speed of the output circuit and obtain a larger current per unit area, the limit on the minimum operating power supply voltage caused by the enable threshold voltage is eliminated, and two or more different high-speed data transmission standards become compatible. Therefore the chip may work in two environments with different output levels.

Figure 3:
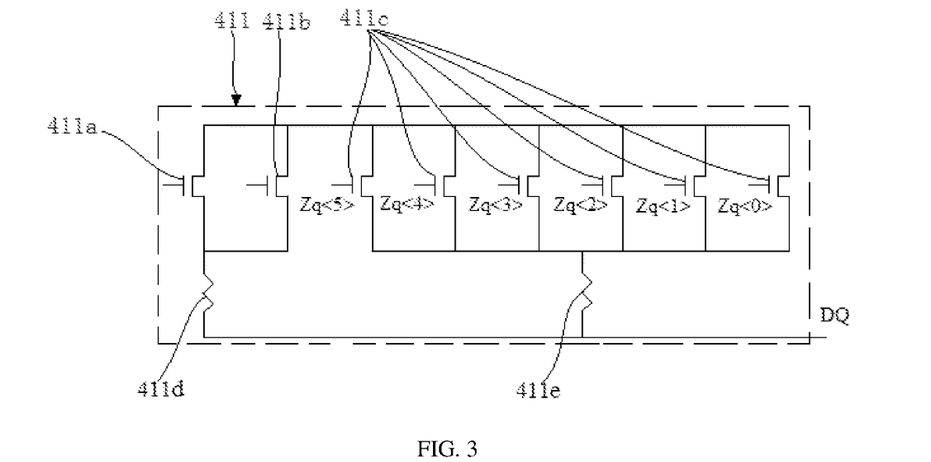
FIG. 3 is a schematic structural diagram of a pull-up branch in a pull-up circuit according to an embodiment of the present invention.

In an embodiment, referring to FIG. 2 and FIG. 3, the pull-up circuit 410 includes a plurality of parallel pull-up branches 411, and each of the pull-up branches 411 includes a first thin-gate low-threshold NMOS transistor 411a. The drain of the first thin-gate low-threshold NMOS transistor 411a is connected to a power supply voltage, and the gate of the first thin-gate low-threshold NMOS transistor 411a is configured to receive a pull-up voltage signal output by the third-stage circuit 300. The sources of the first thin-gate low-threshold NMOS transistors 411a of the pull-up branches 411 are connected as a data output terminal. The first thin-gate low-threshold NMOS transistors 411a in the pull-up branches 411 may have substantially same structures.

Figure 4:
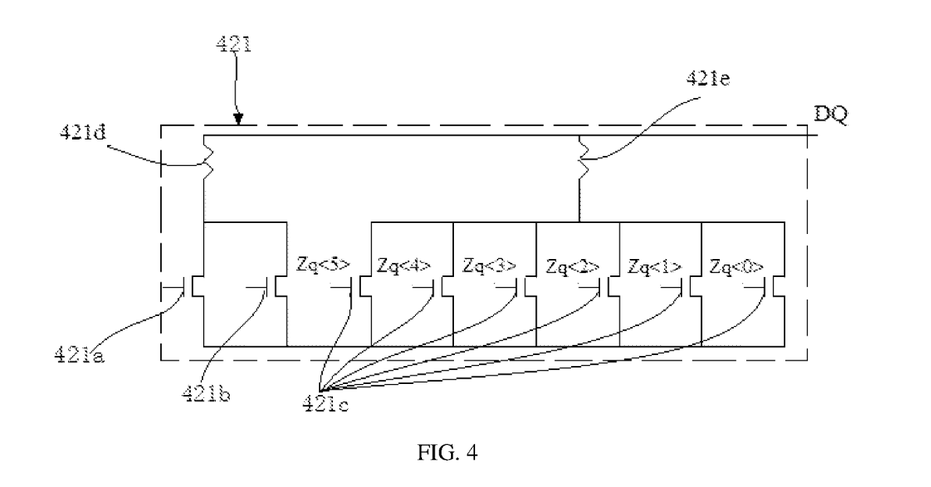
FIG. 4 is a schematic structural diagram of a pull-down branch in a pull-down circuit according to an embodiment of the present invention.

In an embodiment, referring to FIG. 2 and FIG. 4, the pull-down circuit 420 includes a plurality of parallel pull-down branches 421, and each of the pull-down branches 421 includes a second thin-gate low-threshold NMOS transistor 421a. The source of the second thin-gate low-threshold NMOS transistor 421a is grounded, the drain of the second thin-gate low-threshold NMOS transistor 421a is connected to the source of the first thin-gate low-threshold NMOS transistor 411a, and the gate of the second thin-gate low-threshold NMOS transistor 421a is configured to receive a pull-down voltage signal output by the third-stage circuit 300. The second thin-gate low-threshold NMOS transistors 421a in the pull-down branches 421 may have substantially same structures.

In this embodiment, the thin-gate low-threshold NMOS transistor is used in the pull-up circuit 410 and the pull-down circuit 420, to eliminate the limit on the minimum operating power supply voltage caused by an enable threshold voltage of an output transistor in a CMOS structure, so that the fourth-stage circuit 400 meets a plurality of output voltage standards.

In an embodiment, the third-stage circuit 300 is further configured to output a plurality of pull-up ZQ calibration signals during ZQ calibration.

Referring to FIG. 3, each of the pull-up branches 411 includes a plurality of third thin-gate low-threshold NMOS transistors 411c, and the third thin-gate low-threshold NMOS transistor 411c in each pull-up branch 411 is connected in parallel to the first thin-gate low-threshold NMOS transistor 411a. The gate of the third thin-gate low-threshold NMOS transistor 411c is configured to receive the pull-up ZQ calibration signal, and the third thin-gate low-threshold NMOS transistor 411c is configured to adjust an equivalent resistance of the pull-up branch 411 to RZQ according to the pull-up ZQ calibration signal.

In an embodiment, the third-stage circuit 300 is further configured to output a plurality of pull-down ZQ calibration signals during ZQ calibration.

Referring to FIG. 4, each of the pull-down branches 421 includes a plurality of fourth thin-gate low-threshold NMOS transistors 421c, and the fourth thin-gate low-threshold NMOS transistor 421c in each pull-down branch 421 is connected in parallel to the second thin-gate low-threshold NMOS transistor 421a. The gate of the fourth thin-gate low-threshold NMOS transistor 421c is configured to receive the pull-down ZQ calibration signal, and the fourth thin-gate low-threshold NMOS transistor 421c is configured to adjust an equivalent resistance of the pull-down branch to RZQ according to the pull-down ZQ calibration signal.

Further, the plurality of third thin-gate low-threshold NMOS transistors 411c and the plurality of fourth thin-gate low-threshold NMOS transistors 421c each have successively increasing equivalent width-to-length ratios.

Based on the foregoing embodiment, referring to FIG. 3, in a specific embodiment, the third-stage circuit 300 is further configured to output six pull-up ZQ calibration signals Zq<0>, Zq<1>, Zq<2>, Zq<3>, Zq<4>, and Zq<5> during ZQ calibration.

Each pull-up branch 411 includes six third thin-gate low-threshold NMOS transistors 411c. The gate of one third thin-gate low-threshold NMOS transistor 411c is connected to one calibration signal in the pull-up ZQ calibration signals Zq<5:0>.

Referring to FIG. 4, the third-stage circuit 300 is further configured to output six pull-down ZQ calibration signals Zq<0>, Zq<1>, Zq<2>, Zq<3>, Zq<4>, and Zq<5> during ZQ calibration.

Each pull-down branch 421 includes six fourth thin-gate low-threshold NMOS transistors 421c. The gate of one fourth thin-gate low-threshold NMOS transistor 421c is connected to one calibration signal in the pull-down ZQ calibration signals Zq<5:0>.

In a specific embodiment, the equivalent width-to-length ratio of each of the six third thin-gate low-threshold NMOS transistors 411c and the six fourth thin-gate low-threshold NMOS transistors 421c is 1:2:4:8:16:32.

According to the JEDEC memory standards, pull-down driver strength (that is, an equivalent pull-down output resistance) of the output circuit has six options: RZQ/1 to RZQ/6. Because six parallel branches of the same structure are used for a pull-down output stage, an equivalent resistance of each pull-down branch is adjusted to RZQ, and a preferred value of RZQ includes 240Ω. According to the JEDEC memory standards, the pull-up circuit corresponds to six ODT resistance values. To control VOH=VDDQ/3, six parallel branches of the same structure are also used for a pull-up output stage, and an equivalent resistance of each pull-up branch is also adjusted to RZQ.

In this embodiment, six thin-gate low-threshold NMOS transistors are connected in parallel on each pull-up branch 411 and each pull-down branch 421 for ZQ calibration, and the equivalent resistance of each of the pull-up branch 411 and the pull-down branch 421 is effectively adjusted to the reference resistance.

In an embodiment, referring to FIG. 2, the pull-up circuit 410 further includes a pull-up switch module 430.

The pull-up switch module 430 includes a thick-gate high-threshold NMOS transistor 431. The drain of the thick-gate high-threshold NMOS transistor 431 is connected to the power supply voltage, the source of the thick-gate high-threshold NMOS transistor 431 is connected to the drain of the first thin-gate low-threshold NMOS transistor 411a, and the gate of the thick-gate high-threshold NMOS transistor 431 is configured to receive a high-voltage threshold signal output by the third-stage circuit 300. When the pull-up circuit 410 uses the first thin-gate low-threshold NMOS transistor 411a, the thick-gate high-threshold NMOS transistor 431 is connected between the power supply voltage and the first thin-gate low-threshold NMOS transistor 411a, thereby effectively reducing a static leakage current. In addition, to reduce the impact of a relatively large equivalent resistance of the thick-gate high-threshold NMOS transistor 431 on the pull-up switch module 430, during ZQ calibration, the pull-up switch module 430 is included together for calibration. In addition, the accuracy and linearity of the on-resistance are not affected when all the branches are connected in parallel.

In an embodiment, referring to FIG. 3, each of the pull-up branches 410 further includes at least one first low-voltage calibration MOS transistor 411b, the first low-voltage calibration MOS transistor 411b is connected in parallel to the first thin-gate low-threshold NMOS transistor 411a, the gate of the first low-voltage calibration MOS transistor 411b is connected to the third-stage circuit, and the first low-voltage calibration MOS transistor 411b is configured to be turned on at the time of receiving a low-voltage signal.

In an embodiment, referring to FIG. 4, each of the pull-down branches 420 further includes at least one second low-voltage calibration MOS transistor 421b, the second low-voltage calibration MOS transistor 421b is connected in parallel to the second thin-gate low-threshold NMOS transistor 421a, the gate of the second low-voltage calibration MOS transistor 421b is connected to the third-stage circuit 300, and the second low-voltage calibration MOS transistor 421b is configured to be turned on at the time of receiving a low-voltage signal.

The low-voltage signals received by the first low-voltage calibration MOS transistor 411b and the second low-voltage calibration MOS transistor 421b and the pull-up/pull-down voltage signal are homologous signals.

In a specific embodiment, both the first low-voltage calibration MOS transistor 411b and the second low-voltage calibration MOS transistor 421b are thin-gate low-threshold NMOS transistors, and the thin-gate low-threshold NMOS transistors are corrected in parallel in the pull-up/pull-down circuit for correction, so as to effectively prevent the case below: The equivalent resistance in the pull-up/pull-down circuit has a relatively large change and is completely dependent on ZQ calibration, and a calibration range is narrowed.

In an embodiment, referring to FIG. 3, a first fixed-value resistor 411d is connected in series between the data output terminal and a source connection terminal of the first thin-gate low-threshold NMOS transistor 411a and the first low-voltage calibration MOS transistor 411b. A second fixed-value resistor 411e is connected in series between a source connection terminal of the plurality of third thin-gate low-threshold NMOS transistors 411c and the data output terminal DQ.

Referring to FIG. 4, a third fixed-value resistor 421d is connected in series between the data output terminal and a source connection terminal of the second thin-gate low-threshold NMOS transistor 421a and the second low-voltage calibration MOS transistor 421b, and a fourth fixed-value resistor 421e is connected in series between a source connection terminal of the plurality of fourth thin-gate low-threshold NMOS transistors 421c and the data output terminal.

In this embodiment, a resistor is separately connected in series to the MOS transistor in the pull-up circuit 410 or the pull-down circuit 420. In this way, when settings of the ZQ calibration signal are adjusted, the precision and linearity of the MOS transistor in the pull-up circuit 410 or the pull-down circuit 420 can be maintained better.

Figure 5:
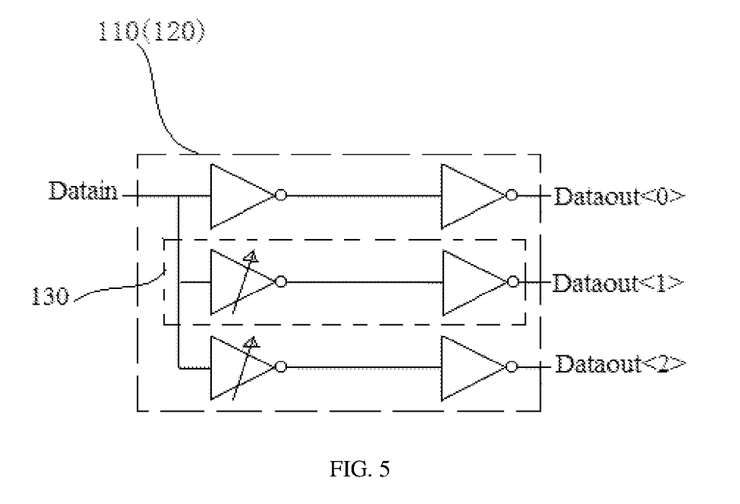
FIG. 5 is a schematic structural diagram of a first-stage circuit according to an embodiment of the present invention.

In an embodiment, referring to FIG. 5, the first-stage circuit 100 includes a first pull-up control module 110 and a first pull-down control module 120 that are of the same structure, and both the first pull-up control module 110 and the first pull-down control module 120 are configured to delay a read data signal and divide and output the data signal into data signals of a plurality of rate levels.

In a specific embodiment, referring to FIG. 5, both the first pull-up control module 110 and the first pull-down control module 120 include three delay units 130. Both the first pull-up control module 110 and the first pull-down control module 120 are configured to divide and output, by using the three delay units 130, the read serial data into data signals of three rate levels (fast, medium, and slow), that is, a fast signal Dataout<0>, a medium signal Dataout<1>, and a slow signal Dataout<2>.

In this embodiment, driver transistors of different driver strength are used as the delay units 130 to delay the signal, so as to generate data signals of different rate levels. In this way, when the data signal is transmitted to the fourth-stage circuit 400, driver transistors in the circuit are prevented from being turned on at the same time; otherwise, this may cause large noise interference on the output-stage power supply and ground terminal. In addition, a voltage conversion rate of the output-stage signal can be partly controlled by dividing the signal into signals of different rate levels.

In an embodiment, the second-stage circuit includes a second pull-up control module 220, a second pull-down control module 210, and a pull-up switch control module 230.

Figure 7:
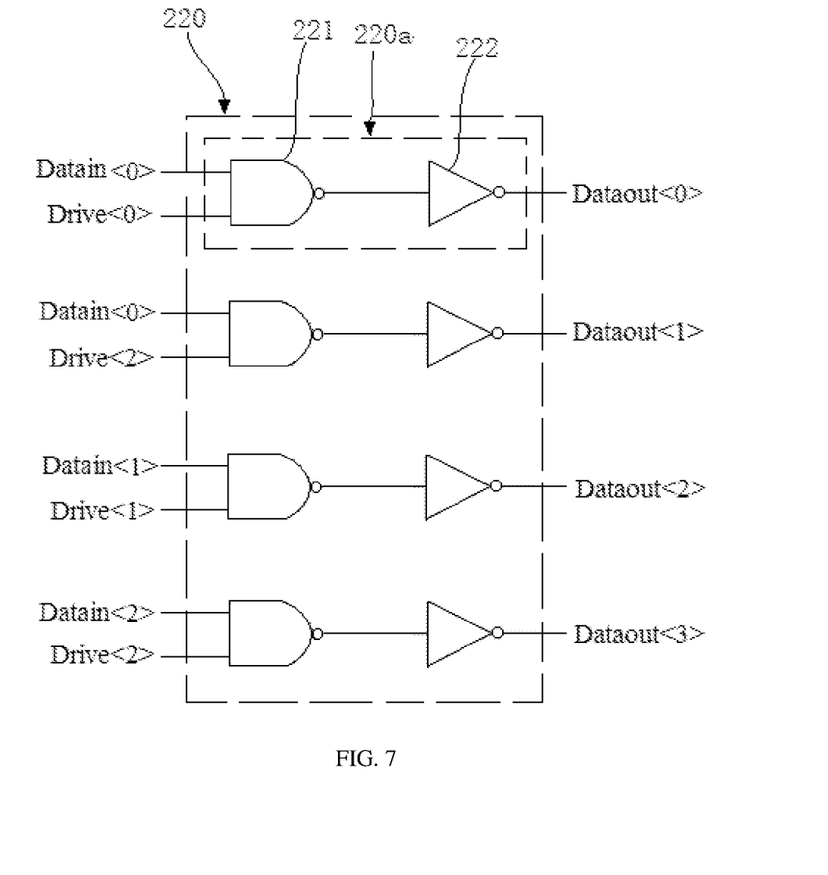
FIG. 7 is a schematic structural diagram of a pull-up control module in a second-stage circuit according to an embodiment of the present invention.

Referring to FIG. 7, the second pull-up control module 220 is configured to: receive a data signal output by the first pull-up control module 110, and according to pull-up driver setting strength, select a path to output the data signal.

Figure 6:
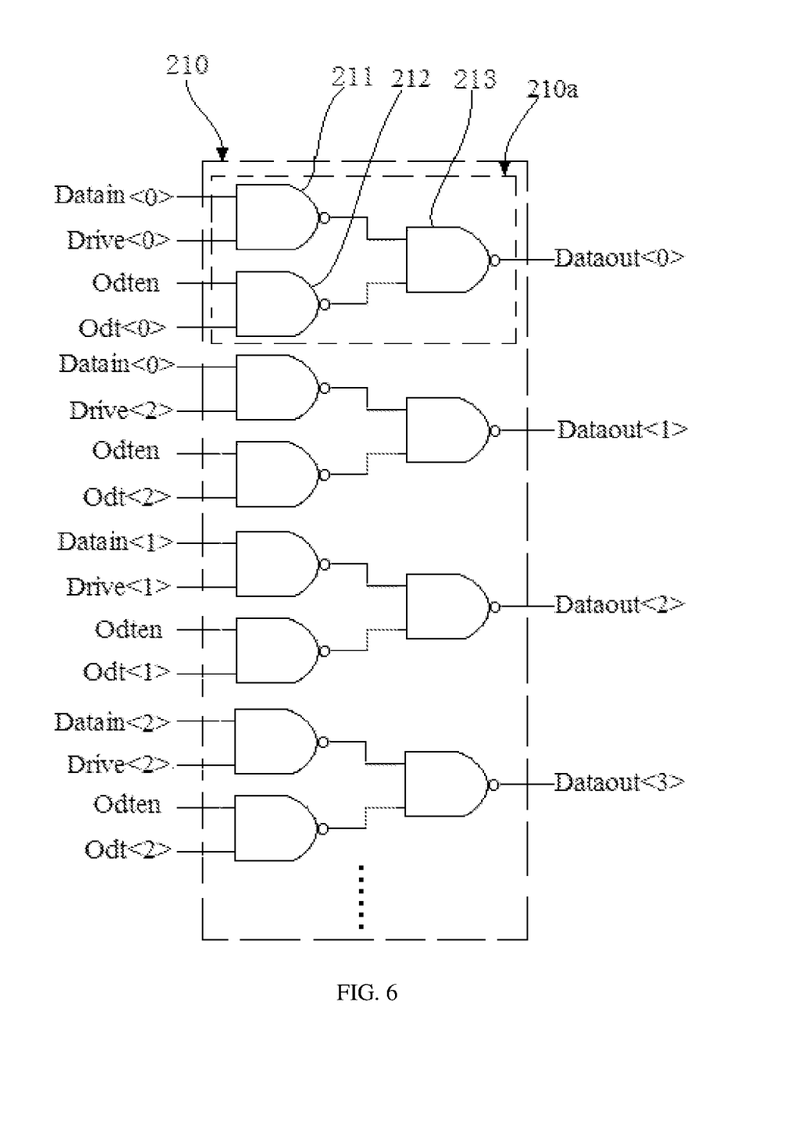
FIG. 6 is a schematic structural diagram of a pull-down control module in a second-stage circuit according to an embodiment of the present invention.

Referring to FIG. 6, the second pull-down control module 210 is configured to: receive a data signal output by the first pull-down control module 120, and according to pull-down driver setting strength and an ODT enable signal, select a path to output the data signal.

Figure 8:
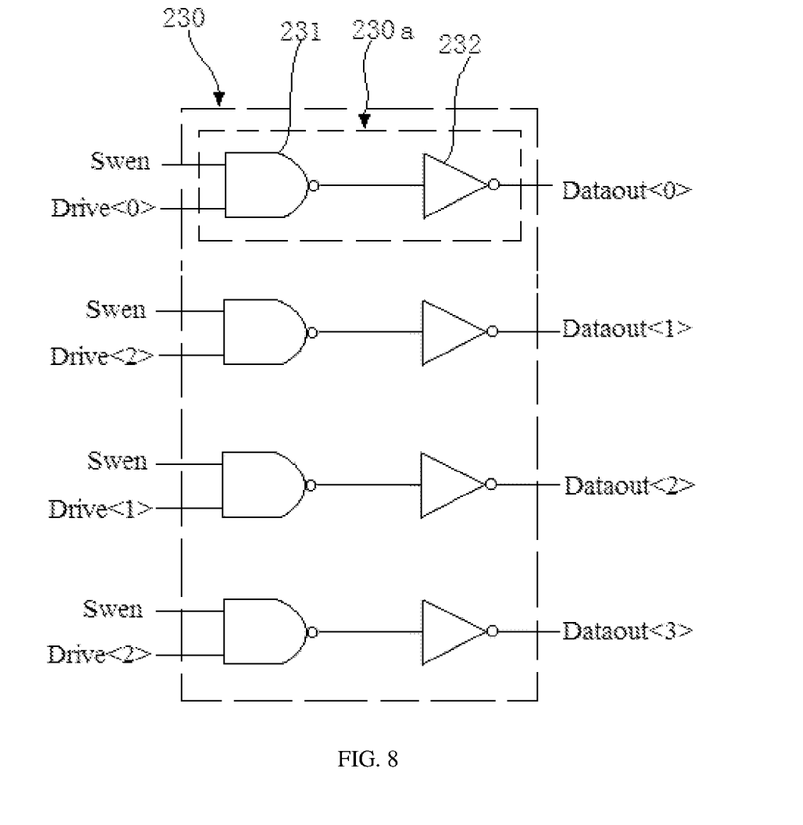
FIG. 8 is a schematic structural diagram of a pull-up switch module in a second-stage circuit according to an embodiment of the present invention.

Referring to FIG. 8, the pull-up switch control module 230 is configured to receive a switch enable signal and reuse the pull-up driver setting strength, so as to control on/off of each path in the second pull-up control module 220.

In a specific embodiment, referring to FIG. 6, the second pull-down control module 210 includes four pull-down path units 210a. Each of the pull-down path units 210a includes a first NAND gate 211, a second NAND gate 212, and a third NAND gate 213. One input terminal of the first NAND gate 211 is a driver strength setting terminal, one input terminal of the second NAND gate 212 is an ODT (output high level) enable signal terminal, and the other input terminal of the second NAND gate 212 is an ODT setting terminal. Output terminals of the first NAND gate and the second NAND gate 212 are both connected to an input terminal of the third NAND gate 213, and an output terminal of the third NAND gate 213 outputs a data signal. The other input terminals of the first NAND gates 211 in two pull-down path units 210a receive a fast data signal Datain<0> output by the first pull-down control module 120, and output terminals of corresponding third NAND gates 213 output fast data signals Dataout<0> and Dataout<1>. The other input terminals of the first NAND gates 211 in the other two pull-down path units 210a receive a medium data signal Datain<1> and a slow data signal Datain<2> that are output by the first pull-down control module 120, and output terminals of corresponding third NAND gates 213 output a medium data signal Dataout<2> and a slow data signal Dataout<3>.

When the memory is in the read data mode, the ODT mode is disabled, the ODT enable signal terminal (Odten) is 0, and the output data signals (Dataout<3:0>) are controlled by driver strength setting terminals (Drive<2:0>).

When the memory is in the write data mode, the ODT mode is enabled, the ODT enable signal terminal (Odten) is 1, and the output data signals (Dataout<3:0>) are controlled by ODT setting terminals (Odt<2:0>).

Different output strengths may correspond to different combinations of fast and slow signals. If driver strength is weak, fast output may be enabled and a fast signal is used. If driver strength is strong, fast and slow signals should be combinedly used to reduce noise.

In a specific embodiment, referring to FIG. 7, the second pull-up control module 220 includes four pull-up path units 220a. Each of the pull-up path units 220a includes a fourth NAND gate 221 and a first phase inverter 222. One input terminal of the fourth NAND gate 221 is a driver strength setting terminal, an output terminal of the fourth NAND gate 221 is connected to an input terminal of the first phase inverter 222, and an output terminal of the first phase inverter 222 outputs a data signal. The other input terminals of fourth NAND gates 221 in two pull-up path units 220a receive a fast data signal Datain<0> output by the first pull-up control module 110, and output terminals of corresponding first phase inverters 222 output fast data signals Dataout<0> and Dataout<1>. The other input terminals of fourth NAND gates 221 in the other two pull-up path units 220a receive a medium data signal Datain<1> and a slow data signal Datain<2> that are output by the first pull-up control module 110, and output terminals of corresponding first phase inverters 222 output a medium data signal Dataout<2> and a slow data signal Dataout<3>.

When the memory is in the read data mode, the output data signals (Dataout<3:0>) of the second pull-up control module 220 are controlled by driver strength setting terminals (Drive<2:0>). The ODT in the memory is pull-down grounded, and the second pull-up control module 220 is not controlled by the ODT.

In a specific embodiment, referring to FIG. 8, the pull-up switch control module 230 includes a plurality of pull-up switch units 230a. Each of the pull-up switch units 230a includes a fifth NAND gate 231 and a second phase inverter 232. One input terminal of the fifth NAND gate 231 is a switch enable signal terminal (Swen), the other input terminal of the fifth NAND gate 231 is a pull-up driver strength setting terminal (Drive<2:0>), an output terminal of the fifth NAND gate 231 is connected to an input terminal of the second phase inverter 232, and an output terminal of the second phase inverter 232 outputs a data signal (Dataout<3:0>). The pull-up driver strength is set to reuse driver strength settings in the second pull-up control module 220, so that one pull-up switch unit 230a corresponds to one pull-up path unit 220a.

The memory reuses the driver strength setting terminal (Drive<2:0>) of the second pull-up control module 220 to control the pull-up switch unit 230a, that is, one pull-up switch unit 230a controls one pull-up path unit 220a.

Figure 9:
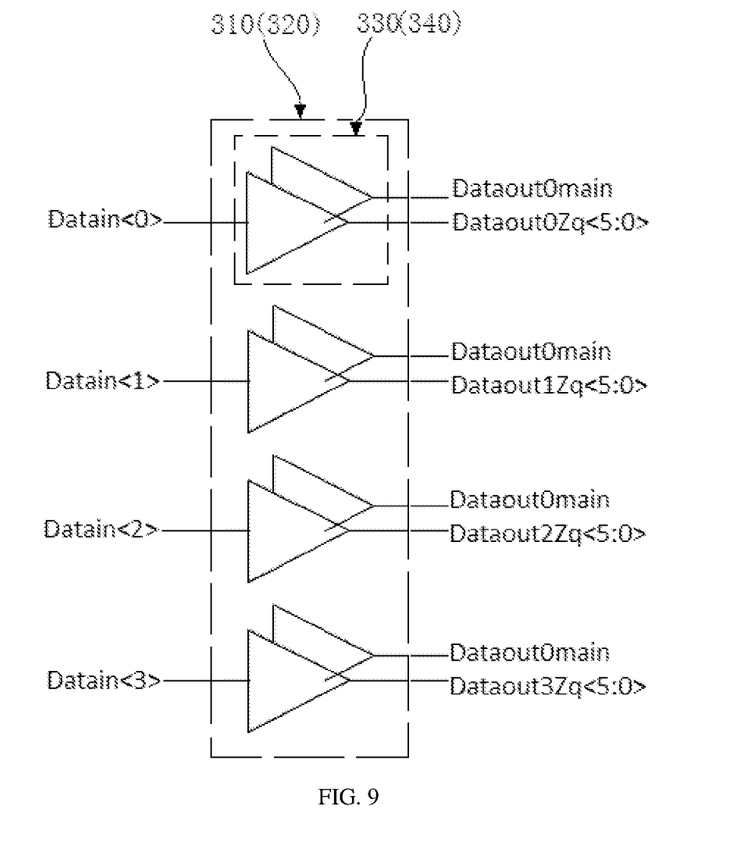
FIG. 9 is a schematic structural diagram of a third-stage circuit according to an embodiment of the present invention.

In an embodiment, referring to FIG. 9, the third-stage circuit 300 includes a third pull-up control module 310 and a third pull-down control module 320 that have the same structure.

Referring to FIG. 9, an input terminal of the third pull-up control module 310 is connected to the second pull-up control module 220, and an output terminal of the third pull-up control module 310 is connected to the gate of the first thin-gate low-threshold NMOS transistor 411a; and the third pull-up control module 310 is configured to convert a received data signal Datain x into the pull-up voltage signal Dataout0main of the same rate and the pull-up ZQ calibration signal DataoutxZq<n:0> corresponding to the received data signal, where x≥0, and n≥1. In FIG. 9, x=0, 1, 2, 3, and n=5.

Referring to FIG. 9, an input terminal of the third pull-down control module 320 is connected to the second pull-down control module 210, and an output terminal of the third pull-down control module 320 is connected to the gate of the second thin-gate low-threshold NMOS transistor 421a; and the third pull-down control module 320 is configured to convert a received data signal Datain x into the pull-down voltage signal Dataout0main of the same rate and the pull-down ZQ calibration signal DataoutxZq<n:0> corresponding to the received data signal. In FIG. 9, x=0, 1, 2, 3, and n=5.

In a specific embodiment, referring to FIG. 9, the third pull-up control module 310 is configured to convert the two fast data signals and the medium and slow data signals Datain<3:0> received from the second pull-up control module 220 into the pull-up voltage signal Dataout0main and the pull-up ZQ calibration signals Dataout<3:0>Zq<5:0> corresponding to the received data signals (Datain and Dataout represent only the input and output statuses of the data signals).

In a specific embodiment, referring to FIG. 9, the third pull-down control module 320 is configured to convert the two fast data signals and the medium and slow data signals Datain<3:0> received from the second pull-down control module 210 into the pull-down voltage signal Dataout0main of the same rate and the pull-down ZQ calibration signals Dataout<3:0>Zq<5:0> corresponding to the data signals. Dataout<3:0>Zq<5:0> is the ZQ calibration signals Zq<5:0> input into the fourth-stage circuit 400.

Figure 10:
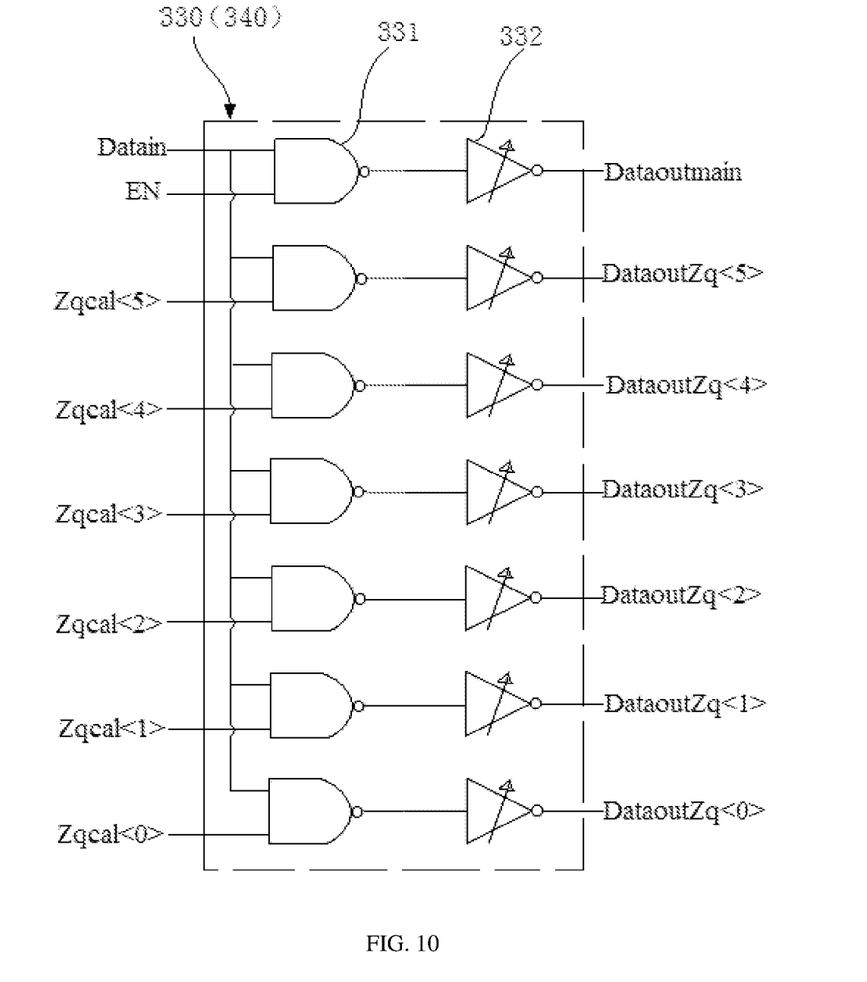
FIG. 10 is a schematic structural diagram of a pull-up control submodule (pull-down control submodule) in a third-stage circuit according to an embodiment of the present invention.

In a specific embodiment, referring to FIG. 9, the third pull-up control module 310 includes four pull-up control submodules 330. Referring to FIG. 10, the pull-up control submodule 330 includes seven sixth NAND gates 331 and seven third phase inverters 332. One input terminal of each sixth NAND gate 331 receives one piece of data information Datain output by the second pull-up control module 220, the other input terminal of the first sixth NAND gate 331 is connected to a reference signal EN, the other input terminals of the other six sixth NAND gates 331 are connected to ZQ calibration values Zqcal<5:0>, and an output terminal of each sixth NAND gate 331 is connected to an input terminal of one third phase inverter 332. The seven third phase inverters 332 sequentially output a pull-up voltage signal Dataoutmain and pull-up ZQ calibration signals DataoutZq<5:0>.

Output terminals of the four pull-up control submodules 330, in the third pull-up control module 310, that receive the fast, medium, and slow data signals are connected to the gates of the six first thin-gate low-threshold NMOS transistors 411a in the pull-up circuit 410 according to a ratio of 1:2:2:1 or 2:1:2:1, so as to ensure that the fast data signal is connected to the gates of three first thin-gate low-threshold NMOS transistors 411a, the medium data signal is connected to the gates of two first thin-gate low-threshold NMOS transistors 411a, and the slow data signal is connected to the gate of one first thin-gate low-threshold NMOS transistor 411a.

In a specific embodiment, referring to FIG. 9, the third pull-down control module 320 includes four pull-down control submodules 340. The pull-down control submodule 340 and the pull-up control submodule 330 have the same structure.

Referring to FIG. 10, the pull-down control submodule 340 includes seven sixth NAND gates 331 and seven third phase inverters 332. One input terminal of each sixth NAND gate 331 receives one piece of data information Datain output by the second pull-down control module 210, the other input terminal of the first sixth NAND gate 311 is connected to a reference signal EN, the other input terminals of the other six sixth NAND gates 331 are connected to ZQ calibration values Zqcal<5:0>, and an output terminal of each sixth NAND gate 331 is connected to an input terminal of one third phase inverter 332. The seven third phase inverters 332 sequentially output a pull-down voltage signal Dataoutmain and pull-down ZQ calibration signals DataoutZq<5:0>.

Output terminals of the four pull-down control submodules 340, in the third pull-down control module 320, that receive the fast, medium, and slow data signals are connected to the gates of the six second thin-gate low-threshold NMOS transistors 421a in the pull-down circuit 420 according to a ratio of 1:2:2:1 or 2:1:2:1, so as to ensure that the fast data signal is connected to the gates of three second thin-gate low-threshold NMOS transistors 421a, the medium data signal is connected to the gates of two second thin-gate low-threshold NMOS transistors 421a, and the slow data signal is connected to the gate of one second thin-gate low-threshold NMOS transistor 421a.

In this embodiment, a transmission path of a data signal is allocated and selected according to settings of a ZQ calibration value, and a voltage conversion rate of a signal output by the third-stage circuit 300 is adjusted by using the third phase inverter 332 whose voltage conversion rate is adjustable, so as to control the conversion rate of the fourth-stage circuit 400.

To achieve the foregoing objective, the present invention provides a chip, including the output circuit of the foregoing implementation.

The chip in this embodiment optimizes control of parameters under the condition of meeting the JEDEC memory standards and can be applied to two different memory data output environments.

The foregoing describes merely specific implementations of the present invention, but the protection scope of the present invention is not limited thereto. Any variation or replacement that may be readily figured out by a person skilled in the art within the technical scope disclosed in the present invention shall fall within the protection scope of the present invention. Therefore, the protection scope of the present invention shall be subject to the protection scope of the claims.

In descriptions of the present invention, it should be understood that, directions or positional relationships indicated by terms "center", "longitudinal", "transverse", "length", "width", "thickness", "above", "below", "in front of", "behind", "left", "right", "vertical", "horizontal", "top", "bottom", "inside", "outside", "clockwise", "counterclockwise", "axial", "radial", "circumferential", etc. are based on orientations or positional relationships shown in the accompanying drawings, and they are used only for describing the present invention and for description simplicity, but do not indicate or imply that an indicated apparatus or element must have a specific orientation or be constructed and operated in a specific orientation. Therefore, it cannot be understood as a limitation on the present invention.

In addition, the terms "first" and "second" are merely used for description, and shall not be understood as an indication or implication of relative importance or implicit indication of the number of indicated technical features. Therefore, a feature limited by "first" or "second" can explicitly or implicitly include one or more such features. In the description of the present invention, "a plurality of" means two or more, unless otherwise specifically limited.

In the present invention, terms "install" "link", "connect", "fix", etc. should be understood in a broad sense unless otherwise definitely stipulated or limited. For example, a connection may be a fixed connection, a detachable connection, or an integrated connection; may be a mechanical connection, an electrical connection, or a communication connection; and may be a direct connection, an indirect connection through an intermediate medium, or a connection inside two components or interaction between two components. For a person of ordinary skill in the art, specific meanings of the previous terms in the present invention can be understood based on a specific situation.

In the present invention, unless otherwise specified and limited, that a first feature is "above" or "below" a second feature may include direct contact between the first feature and the second feature, or may include indirect contact between the first feature and the second feature through other features between the first feature and the second feature. In addition, that the first feature is "above" the second feature can mean that the first feature is right above or diagonally above the second feature, or simply indicate that the first feature is at a higher position than the second feature. That the first feature is "below" the second feature can mean that the first feature is right below or diagonally below the second feature, or simply indicate that the first feature is at a lower position than the second feature.

The above disclosure provides many different embodiments or examples for implementing different structures of the present invention. To simplify the disclosure of the present invention, the components and settings of particular examples are described above. Certainly, they are merely examples and are not intended to limit the present invention. In addition, the present invention may repeat reference numbers and/or reference letters in different examples for simplicity and clarity purposes, and the repetition does not indicate a relationship between the various implementations and/or settings discussed. In addition, the present invention provides examples of various specific processes and materials, but a person of ordinary skill in the art may be aware of applications of other processes and/or uses of other materials.

What is claimed is:

1. An output circuit, comprising:
   a first-stage circuit, wherein the first-stage circuit is configured to read serial data in a memory and divide the serial data into a plurality of first voltage signals each at a specified rate level;
   a second-stage circuit, connected to the first-stage circuit, wherein the second-stage circuit is configured to: receive the plurality of first voltage signals output by the first-stage circuit, generate a plurality of second voltage signals, and allocate a transmission path to each of the second voltage signals;
   a third-stage circuit, connected to the second-stage circuit, wherein the third-stage circuit is configured to: receive the plurality of second voltage signals output by the second-stage circuit, and allocate a transmission path to each of the second voltage signals according to a ZQ calibration signal; and
   a fourth-stage circuit, connected to the third-stage circuit, wherein the fourth-stage circuit comprises a pull-up circuit and a pull-down circuit, the pull-up circuit and the pull-down circuit each comprise a plurality of parallel thin-gate low-threshold NMOS transistors, and the fourth-stage circuit is configured to receive a plurality of third voltage signals output by the third-stage circuit, and generate output voltage signals of the output circuit according to the third voltage signals.

2. The output circuit according to claim 1, wherein the pull-up circuit comprises a plurality of parallel pull-up branches, each comprising a first thin-gate low-threshold NMOS transistor, a drain of the first thin-gate low-threshold NMOS transistor is connected to a power supply voltage, and a gate of the first thin-gate low-threshold NMOS transistor is configured to receive a pull-up voltage signal output by the third-stage circuit; and sources of the first thin-gate low-threshold NMOS transistors of the pull-up branches are connected as a data output terminal.

3. The output circuit according to claim 2, wherein the pull-down circuit comprises a plurality of parallel pull-down branches, each of the pull-down branches comprises a second thin-gate low-threshold NMOS transistor, a source of the second thin-gate low-threshold NMOS transistor is grounded, a drain of the second thin-gate low-threshold NMOS transistor is connected to the source of the first thin-gate low-threshold NMOS transistor, and a gate of the second thin-gate low-threshold NMOS transistor is configured to receive a pull-down voltage signal output by the third-stage circuit.

4. The output circuit according to claim 3, wherein the third-stage circuit is further configured to output a plurality of pull-up ZQ calibration signals during ZQ calibration; and each of the pull-up branches comprises a plurality of third thin-gate low-threshold NMOS transistors, and the third thin-gate low-threshold NMOS transistor in each pull-up branch is connected in parallel to the first thin-gate low-threshold NMOS transistor; and a gate of the third thin-gate low-threshold NMOS transistor is configured to receive the pull-up ZQ calibration signal, and the third thin-gate low-threshold NMOS transistor is configured to adjust an equivalent resistance of the pull-up branch to RZQ (reference resistance) according to the pull-up ZQ calibration signal.

5. The output circuit according to claim 4, wherein the third-stage circuit is further configured to output a plurality of pull-down ZQ calibration signals during ZQ calibration;

and each of the pull-down branches comprises a plurality of fourth thin-gate low-threshold NMOS transistors, and the fourth thin-gate low-threshold NMOS transistor in each pull-down branch is connected in parallel to the second thin-gate low-threshold NMOS transistor; and a gate of the fourth thin-gate low-threshold NMOS transistor is configured to receive the pull-down ZQ calibration signal, and the fourth thin-gate low-threshold NMOS transistor is configured to adjust an equivalent resistance of the pull-down branch to RZQ (reference resistance) according to the pull-down ZQ calibration signal.

6. The output circuit according to claim 5, wherein the plurality of third thin-gate low-threshold NMOS transistors and the plurality of fourth thin-gate low-threshold NMOS transistors each have successively increasing equivalent width-to-length ratios.

7. The output circuit according to claim 5, wherein the pull-up circuit further comprises a pull-up switch module, the pull-up switch module comprises the same quantity of thick-gate high-threshold NMOS transistors as that of the first thin-gate low-threshold NMOS transistors, drains of the thick-gate high-threshold NMOS transistors are connected to the power supply voltage, sources of the thick-gate high-threshold NMOS transistors are respectively connected to the drains of the first thin-gate low-threshold NMOS transistors, and gates of the thick-gate high-threshold NMOS transistors are configured to receive a high-voltage threshold signal output by the third-stage circuit.

8. The output circuit according to claim 7, wherein each of the pull-up branches further comprises at least one first low-voltage calibration MOS transistor, the first low-voltage calibration MOS transistor is connected in parallel to the first thin-gate low-threshold NMOS transistor, a gate of the first low-voltage calibration MOS transistor is connected to the third-stage circuit, and the first low-voltage calibration MOS transistor is configured to be turned on at a time of receiving a low-voltage signal.

9. The output circuit according to claim 8, wherein each of the pull-down branches further comprises at least one second low-voltage calibration MOS transistor, the second low-voltage calibration MOS transistor is connected in parallel to the second thin-gate low-threshold NMOS transistor, a gate of the second low-voltage calibration MOS transistor is connected to the third-stage circuit, and the second low-voltage calibration MOS transistor is configured to be turned on at a time of receiving a low-voltage signal.

10. The output circuit according to claim 7, wherein a first fixed-value resistor is connected in series between the data output terminal and a source connection terminal of the first thin-gate low-threshold NMOS transistor and the first low-voltage calibration MOS transistor, and a second fixed-value resistor is connected in series between a source connection terminal of the plurality of third thin-gate low-threshold NMOS transistors and the data output terminal; and a third fixed-value resistor is connected in series between the data output terminal and a source connection terminal of the second thin-gate low-threshold NMOS transistor and the second low-voltage calibration MOS transistor, and a fourth fixed-value resistor is connected in series between a source connection terminal of the plurality of fourth thin-gate low-threshold NMOS transistors and the data output terminal.

11. The output circuit according to claim 3, wherein the first-stage circuit comprises a first pull-up control module and a first pull-down control module that are of substantially the same structure, and both the first pull-up control module and the first pull-down control module are configured to delay a read data signal, and divide and output the read data signal into data signals of a plurality of rate levels.

12. The output circuit according to claim 11, wherein the second-stage circuit comprises:
   a second pull-down control module, wherein the second pull-down control module is configured to: receive a data signal output by the first pull-down control module, and according to pull-down driver setting strength and an ODT enable signal, select a path to output the data signal;
   a second pull-up control module, wherein the second pull-up control module is configured to: receive a data signal output by the first pull-up control module, and according to pull-up driver setting strength, select a path to output the data signal; and
   a pull-up switch control module, wherein the pull-up switch control module is configured to receive a switch enable signal and reuse the pull-up driver setting strength, so as to control each path in the second pull-up control module to be in one of an ON state and an OFF state.

13. The output circuit according to claim 12, wherein the third-stage circuit comprises a third pull-up control module and a third pull-down control module that have substantially the same structure;
   an input terminal of the third pull-up control module is connected to the second pull-up control module and a ZQ calibration value, and an output terminal of the third pull-up control module is connected to the gate of the first thin-gate low-threshold NMOS transistor; and the third pull-up control module is configured to convert a received data signal and the ZQ calibration value into the pull-up voltage signal of the same rate and the pull-up ZQ calibration signal corresponding to the received data signal; and
   an input terminal of the third pull-down control module is connected to the second pull-down control module and a ZQ calibration value, and an output terminal of the third pull-down control module is connected to the gate of the second thin-gate low-threshold NMOS transistor; and the third pull-down control module is configured to convert a received data signal and the ZQ calibration value into the pull-down voltage signal of the same rate and the pull-down ZQ calibration signal corresponding to the received data signal.

14. A chip comprising an output circuit, the output circuit comprising:
   a first-stage circuit, wherein the first-stage circuit is configured to read serial data in a memory and divide the serial data into a plurality of first voltage signals each at a specified rate level;
   a second-stage circuit, connected to the first-stage circuit, wherein the second-stage circuit is configured to: receive the plurality of first voltage signals output by the first-stage circuit, generate a plurality of second voltage signals, and allocate a transmission path to each of the second voltage signals;
   a third-stage circuit, connected to the second-stage circuit, wherein the third-stage circuit is configured to: receive the plurality of second voltage signals output by the second-stage circuit, and allocate a transmission path to each of the second voltage signals according to a ZQ calibration signal; and
   a fourth-stage circuit, connected to the third-stage circuit, wherein the fourth-stage circuit comprises a pull-up circuit and a pull-down circuit, the pull-up circuit and the pull-down circuit each comprise a plurality of parallel thin-gate low-threshold NMOS transistors, and the fourth-stage circuit is configured to receive a plurality of third voltage signals output by the third-stage circuit, and generate output voltage signals of the output circuit according to the third voltage signals.

15. The chip according to claim 14, wherein the pull-up circuit comprises a plurality of parallel pull-up branches, each comprising a first thin-gate low-threshold NMOS transistor, a drain of the first thin-gate low-threshold NMOS transistor is connected to a power supply voltage, and a gate of the first thin-gate low-threshold NMOS transistor is configured to receive a pull-up voltage signal output by the third-stage circuit; and sources of the first thin-gate low-threshold NMOS transistors of the pull-up branches are connected as a data output terminal.

16. The chip according to claim 15, wherein the pull-down circuit comprises a plurality of parallel pull-down branches, each of the pull-down branches comprises a second thin-gate low-threshold NMOS transistor, a source of the second thin-gate low-threshold NMOS transistor is grounded, a drain of the second thin-gate low-threshold NMOS transistor is connected to the source of the first thin-gate low-threshold NMOS transistor, and a gate of the second thin-gate low-threshold NMOS transistor is configured to receive a pull-down voltage signal output by the third-stage circuit.

17. The chip according to claim 16, wherein the third-stage circuit is further configured to output a plurality of pull-up ZQ calibration signals during ZQ calibration; and each of the pull-up branches comprises a plurality of third thin-gate low-threshold NMOS transistors, and the third thin-gate low-threshold NMOS transistor in each pull-up branch is connected in parallel to the first thin-gate low-threshold NMOS transistor; and a gate of the third thin-gate low-threshold NMOS transistor is configured to receive the pull-up ZQ calibration signal, and the third thin-gate low-threshold NMOS transistor is configured to adjust an equivalent resistance of the pull-up branch to RZQ (reference resistance) according to the pull-up ZQ calibration signal.

18. The chip according to claim 17, wherein the third-stage circuit is further configured to output a plurality of pull-down ZQ calibration signals during ZQ calibration; and each of the pull-down branches comprises a plurality of fourth thin-gate low-threshold NMOS transistors, and the fourth thin-gate low-threshold NMOS transistor in each pull-down branch is connected in parallel to the second thin-gate low-threshold NMOS transistor; and a gate of the fourth thin-gate low-threshold NMOS transistor is configured to receive the pull-down ZQ calibration signal, and the fourth thin-gate low-threshold NMOS transistor is configured to adjust an equivalent resistance of the pull-down branch to RZQ (reference resistance) according to the pull-down ZQ calibration signal.

19. The chip according to claim 18, wherein the plurality of third thin-gate low-threshold NMOS transistors and the plurality of fourth thin-gate low-threshold NMOS transistors each have successively increasing equivalent width-to-length ratios.

20. The chip according to claim 18, wherein the pull-up circuit further comprises a pull-up switch module, the pull-up switch module comprises the same quantity of thick-gate high-threshold NMOS transistors as that of the first thin-gate low-threshold NMOS transistors, drains of the thick-gate high-threshold NMOS transistors are connected to the power supply voltage, sources of the thick-gate high-threshold NMOS transistors are respectively connected to the drains of the first thin-gate low-threshold NMOS transistors, and gates of the thick-gate high-threshold NMOS transistors are configured to receive a high-voltage threshold signal output by the third-stage circuit.

* * * * *